United States Patent [19]
Telewski et al.

[11] Patent Number: 5,216,387
[45] Date of Patent: Jun. 1, 1993

[54] NOISE REDUCTION METHOD AND APPARATUS FOR PHASE-LOCKED LOOPS

[75] Inventors: Frederick J. Telewski, Woodinville; Eric R. Drucker, Seattle, both of Wash.

[73] Assignee: John Fluke Mfg. Co., Inc., Everett, Wash.

[21] Appl. No.: 757,075

[22] Filed: Sep. 9, 1991

[51] Int. Cl.$^5$ .................... H03L 7/087; H03L 7/18
[52] U.S. Cl. ........................... 331/11; 331/16; 331/25; 455/260
[58] Field of Search ............. 331/10, 11, 12, 16, 331/17, 18, 25; 375/120; 455/260

[56] References Cited
U.S. PATENT DOCUMENTS 3,571,743 10/1968 Menkes ........................... 331/11
4,888,564 12/1989 Ishigaki ....................... 331/12 X Primary Examiner—David Mis
Attorney, Agent, or Firm—Seed and Berry

[57] ABSTRACT

Method and apparatus for improving the signal-to-noise ratio of a divide-by-N phase-locked loop includes a variable divider circuit to provide a plurality of feedback signals of substantially equal phase. Each of the plurality of feedback signals includes a signal component and a noise component wherein the signal components of the plurality of feedback signals have substantially equal phase and wherein the noise components of the plurality of feedback signals are not substantially correlated. A respective plurality of control circuits is provided to combine the plurality of feedback signals with a reference signal to provide a plurality of control signals wherein each control signal is a substantially direct current voltage the magnitude of which is proportional to the phase difference between the reference signal and the feedback signal which comprised its origin. The plurality of control signals are added to provide a composite control signal so that the signal components of the plurality of control signals add by linear superposition and so that the noise components of the plurality of control signals add by the square root of the sum of their squares, thereby substantially improving the signal-to-noise ratio of the phase-locked loop output.

19 Claims, 3 Drawing Sheets

NOISE REDUCTION METHOD AND APPARATUS FOR PHASE-LOCKED LOOPS

FIELD OF THE INVENTION

The present invention is directed toward phase-locked loops and, more particularly, toward a method and apparatus for providing a phase-locked loop having an improved signal-to-noise ratio.

BACKGROUND OF THE INVENTION

Phase-locked loops have found many applications in various data and signal processing devices. As examples, phase-locked loops are typically used in transmitters and receivers, signal generators, frequency synthesizers, function generators, etc.

One of the more widely used versions of the phase-locked loop is the divide-by-N phase-locked loop. The divide-by-N phase-locked loop includes a divider circuit to divide the frequency of the output from the phase-locked loop by a selectable constant N. The divided output signal is provided to the input of the phase-locked loop as feedback to be combined in a phase detector with a reference signal having a substantially constant frequency. The output from the phase detector is low-pass filtered and voltage amplified to provide a substantially direct current control signal wherein the voltage magnitude of the control signal is indicative of the phase difference between the feedback signal and the reference signal. The control signal is provided to a voltage-controlled oscillator so that the frequency of the oscillator output is proportional to the magnitude of voltage of the control signal.

The phase-locked loop operates to maintain the frequency of the feedback signal equal to the frequency of the reference signal. Since the frequency of the output signal from the phase-locked loop is divided by N to obtain the feedback signal, the frequency $f_o$ of the output signal is N times the frequency $f_r$ of the reference signal, i.e.:

$$f_o = Nf_r$$

The frequency of the output signal may be selected by selecting a proper value of the selectable constant N provided to the divider circuit.

Divide-by-N phase-locked loops suffer from several known disadvantages. One of these disadvantages is phase noise that is present on the output signal. The phase noise that is present on the output signal from the divide-by-N phase-locked loop is due in large measure to phase noise introduced by the divider circuit. The divider circuit introduces phase noise that is typically across the frequency spectrum. Therefore, that portion of the divider circuit phase noise inside the loop bandwidth is not substantially filtered by the action of the phase-locked loop and low-pass filter. Accordingly, this noise is transmitted to the output signal and reduces the signal-to-noise ratio thereof.

Further, it has been noted that the phase noise introduced by the divide-by-N counter is a function of the value of the selectable constant N. In other words, the higher the value of the selectable constant N, the greater the phase noise that is introduced by the divider circuit and transmitted to the output signal. A phase-locked loop having an output signal with a wide frequency range requires a divider circuit with a large value of N and, accordingly, the amount of phase noise is increased.

Conventional methods for reducing phase noise and thereby for improving the signal-to-noise ratio of a divide-by-N phase-locked loop include reducing the loop bandwidth so that the filter and other components of the phase-locked loop naturally filter a greater portion of the phase noise. However, reducing the loop bandwidth decreases the switching speed of the phase-locked loop and, therefore, is an undesirable construction. Further, as mentioned above, phase noise introduced by the divider circuit typically appears across the entire frequency spectrum and is, therefore, impossible to completely filter by reducing the loop bandwidth.

Accordingly, it is desirable to provide a phase-locked loop wherein the phase noise introduced by the divide-by-N divider circuit can be substantially attenuated without unnecessary restriction on the bandwidth or switching speed of the phase-locked loop.

SUMMARY OF THE INVENTION

The present invention comprises a method and apparatus for improving the signal-to-noise ratio of a phase-locked loop. A voltage-controlled oscillator is constructed to be responsive to a composite control signal for providing the variable frequency output signal. A variable divider circuit is constructed to receive as its input the variable frequency output signal and to divide the frequency of the variable frequency output signal by a selectable value, thereby to provide a plurality of feedback signals, each including respective noise and signal components. The phase of each of the plurality of feedback signals is substantially constant and the plurality of respective noise components are not substantially correlated. A composite control circuit is responsive to a reference signal and the plurality of feedback signals to provide the composite control signal. The composite control signal provided by the composite control circuit comprises a substantially direct current voltage with a magnitude that is a function of the phase difference between the reference signal and the plurality of feedback signals. The control circuit is adapted to combine the noise components of the plurality of feedback signals as the square root of the sum of the squares and to combine the signal components by linear superposition to thereby substantially improve the signal-to-noise ratio of the variable frequency output signal.

In the presently preferred embodiment of the invention, the composite control circuit comprises a plurality of control circuits, each being responsive to the reference signal and a respective one of the plurality of feedback signals to provide a control signal. The control signal provided by each control circuit is a substantially direct current voltage having a voltage magnitude that is a function of the phase difference between the reference signal and the respective one of the plurality of feedback signals. The plurality of control circuits thereby provide a plurality of control signals. The composite control circuit further includes a signal adder for adding the plurality of control signals to provide the composite control signal.

In an alternative embodiment of the invention, the variable divider comprises a variable frequency divider circuit for dividing the frequency of the variable frequency output signal by a selectable constant to provide a frequency control signal. The variable divider circuit also includes a plurality of clocking circuits for providing the plurality of feedback signals. Each of the plurality of clocking circuits has a clock input coupled to receive the variable frequency output signal and a data input coupled to receive the frequency control signal. Further, each of the plurality of clocking circuits is constructed to provide a respective one of the plurality of feedback signals so that the magnitude of the respective one of the plurality of feedback signals is substantially equal to the magnitude of the frequency control signal during a predetermined transition of the variable frequency output signal.

In still another alternative embodiment of the invention, the variable divider circuit comprises a plurality of variable frequency divider circuits, each for dividing the frequency of the variable frequency output signal by a selectable constant to provide the plurality of feedback signals. A synchronization circuit is provided for synchronizing the output of the plurality of variable frequency divider circuits thereby to maintain the phase of the plurality of feedback signals substantially constant.

DETAILED DESCRIPTION OF THE INVENTION

Figure 1:
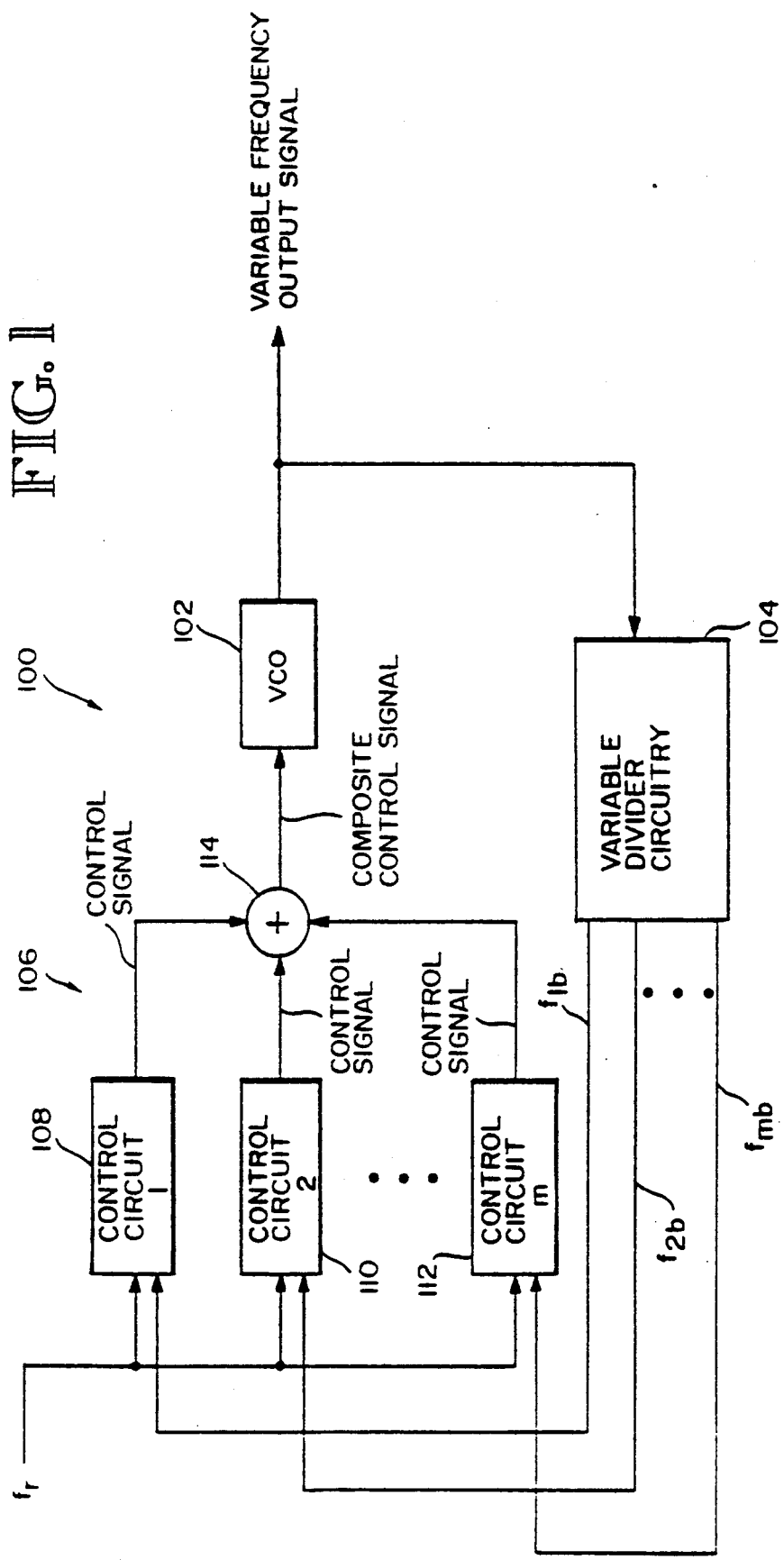
FIG. 1 is an illustrative block diagram of the improved apparatus which comprises the subject invention.

An improved phase-locked loop 100 which comprises the subject invention is illustrated in FIG. 1. The phase-locked loop 100 is constructed as a divide-by-N phase-locked loop adapted to provide a variable frequency output signal. The phase-locked loop 100 includes a voltage controlled oscillator 102 which is responsive to a composite control signal to provide the variable frequency output signal from the phase-locked loop. The voltage controlled oscillator 102 may comprise any of a plurality of known devices for providing a variable frequency output signal in response to a substantially direct current input voltage. As is known in the art, voltage controlled oscillators provide an output signal whose frequency is related to the magnitude of voltage provided at the voltage controlled oscillator input.

The variable frequency output signal from the phase-locked loop 100 is provided to a variable divider circuitry 104. The variable divider circuitry 104 is constructed to divide the frequency of the variable frequency output signal by a selectable constant N. As with conventional divide-by-N phase-locked loops, the frequency $f_o$ of the variable frequency output signal is directly proportional to the value of the selectable constant N and the frequency $f_r$ of the reference signal input to the phase-locked loop:

$$f_o = Nf_r.$$

Unlike conventional dividers, the variable divider circuitry 104 in the feedback path of a divide-by-N phase-locked loop is constructed to provide a plurality of m feedback signals each having a signal component with a frequency equal to the divided frequency of the variable frequency output signal, i.e.:

$$f_{mb} = f_o/N.$$

Further, the plurality of feedback signals are provided so that the phase and magnitude of the signal components of the plurality of feedback signals is substantially equal. The plurality of feedback signals provided by the variable divider circuitry 104 also include respective phase noise components. The variable divider circuitry 104 is constructed so that the phase noise component of the plurality of feedback signals, i.e., the phase noise introduced by the division of the frequency, is not substantially correlated from one feedback signal to another. In other words, the phase noise component of feedback signal $f_{1b}$ is not substantially correlated with the phase noise component of feedback signal $f_{2b}$, etc.

The plurality of feedback signals $f_{1b}-f_{mb}$ are provided to a composite control circuit 106 along with the input reference signal. The composite control signal as the output from the composite control circuit 106. The composite control circuit 106 combines the plurality of feedback signals with the reference signal to provide a substantially direct current voltage that has a magnitude that is a function of the phase difference between the reference signal and the plurality of feedback signals. Further, the composite control circuit 106 is constructed to combine the signal component of the plurality of feedback signals by linear superposition, whereby the phase noise component is combined by the square root of the sum of the squares, to thereby substantially improve the signal-to-noise ratio of the variable frequency output signal, as will be discussed in more detail below.

The composite control circuit 106 includes m control circuits 108-112, each constructed to receive as its input a respective one of said plurality of feedback signals $f_{mb}$ in addition to the reference signal. Each control circuit 108-112 includes apparatus for comparing the reference signal with its respective feedback signal $f_{mb}$ to provide a substantially direct current voltage signal output, referred to as the control signal, wherein the magnitude of the control signal is proportional to the phase difference between the reference signal and its respective feedback signal. Each control signal further includes a phase noise component substantially similar to the phase noise component of the feedback signal from which the control signal originated.

It will be apparent to those skilled in the art that since the variable divider circuitry 104 provides the signal component of each of the plurality of feedback signals $f_{mb}$ with substantially the same phase and magnitude, each of the control signals will have substantially the same direct current voltage. However, since the phase noise component of each of the plurality of feedback signals $f_{mb}$ is not substantially correlated with the phase noise component of any other feedback signal, the phase noise component of the plurality of control signals will also not be substantially correlated.

The composite control circuit 106 further includes a signal adder 114. The signal adder 114 is constructed to add together the plurality of control signals to provide the composite control signal output from the composite control circuit 106. Since the magnitude and phase of the signal component of the plurality of feedback signals are substantially equal, the direct current voltage, both magnitude and phase, of the signal component of each of the control signals will be substantially equal. The plurality of control signals will add by linear superposition so that the composite control signal will have a magnitude m times greater than the magnitude of any individual control signal. Further, since the phase noise components of the plurality of control signals are not substantially correlated, the phase noise components $e_m$ will add as the square root of the sum of their squares i.e.:

$$e_s = [e_1^2 + e_2^2 + \ldots e_m^2]^{\frac{1}{2}}.$$

Since the phase noise is random, it is assumed that:

$$e_1 = e_2 = \ldots = e_m,$$

and, therefore, the sum of the phase noise components of the plurality of control signals equals:

$$e_s = [m]^{\frac{1}{2}} e,$$

As an illustrative example, using two feedback signals, i.e., m=2, the substantially direct current voltage portion of the composite control signal will have twice the magnitude as with one control signal. However, the noise component thereof will be decreased by approximately three decibels, i.e., $(2)^{\frac{1}{2}}$. As will be discussed in more detail below, even greater reductions in phase noise can be obtained by providing more feedback signals from the variable divider circuitry 104 and providing more control circuits 108-112.

Figure 2:
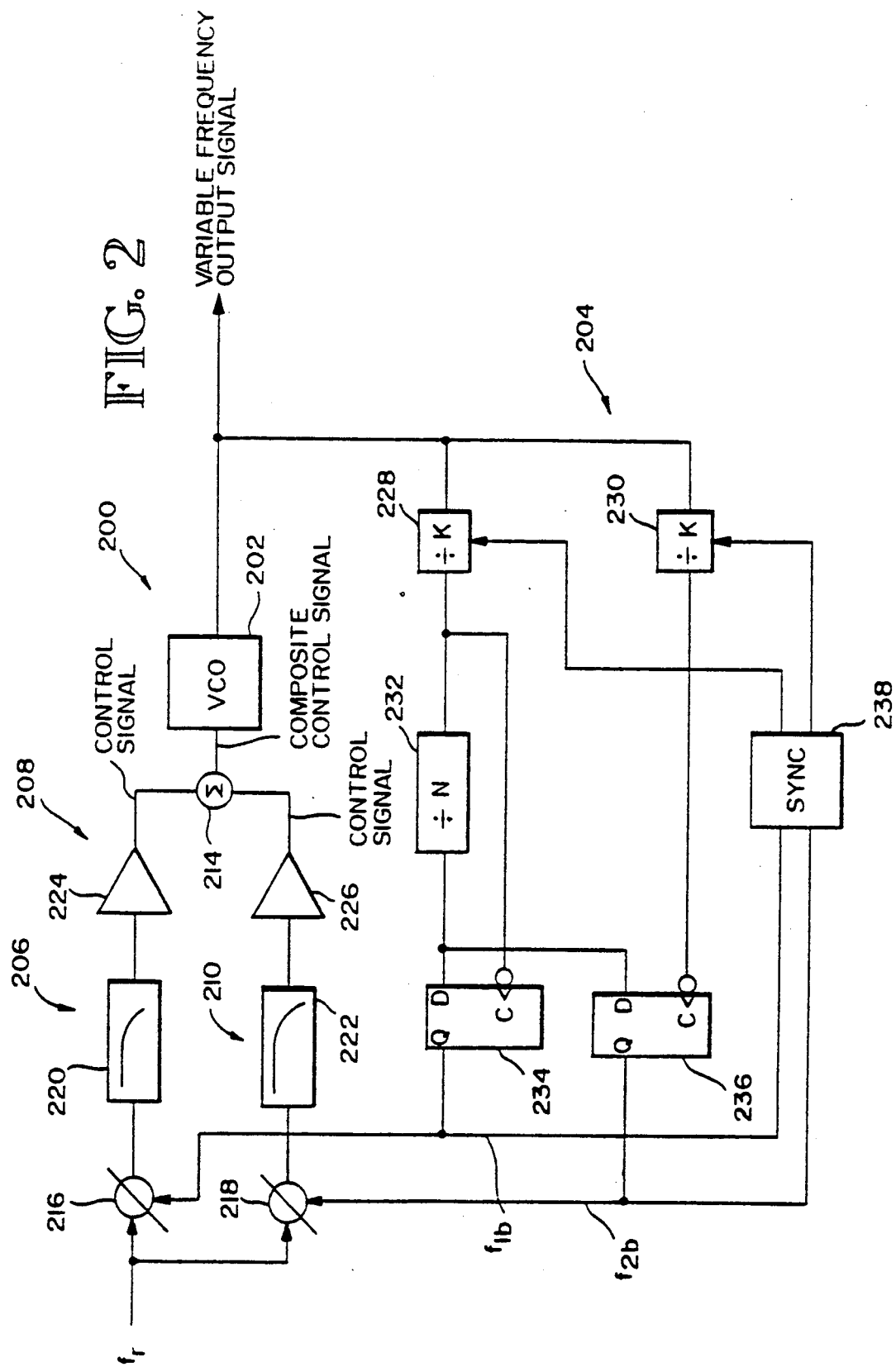
FIG. 2 is a more detailed illustrative block diagram of a first embodiment of the invention.

A more detailed block diagram of a phase-locked loop 200 constructed in accordance with the present invention is illustrated in FIG. 2. Therein a voltage controlled oscillator 202 is responsive to a composite control signal to provide the variable frequency output signal of the phase-locked loop 200. The variable frequency output signal is provided as the input to a variable divider circuit 204. The variable divider circuit 204 is constructed to provide first and second feedback signals, $f_{1b}$ and $f_{2b}$, respectively, to a composite control circuit 206. The composite control circuit 206 includes first and second control circuits 208 and 210 adapted to receive the first and second feedback signals $f_{1b}$ and $f_{2b}$, respectively. The first and second control circuits 208 and 210 each provide control signals to a signal adder 214, which signal adder provides the composite control signal output from the composite control circuit 206.

The first and second control circuits include first and second phase detectors 216 and 218, respectively, for combining the reference signal with the first and second feedback signals $f_{1b}$ and $f_{2b}$, respectively. The phase detectors 216 and 218 comprise conventional circuits for providing a substantially direct current output voltage wherein the magnitude of the phase detector output is proportional to the phase difference between the reference signal and the feedback signal.

The output from the first and second phase detectors 216 and 218 is provided to first and second low pass filters 220 and 222, respectively. As is known in the art, the low pass filters 220 and 222 are provided for filtering out high frequency components of the output from the phase detectors 216 and 218. The low pass filters 220 and 222, like the phase detectors 216 and 218, may comprise conventional circuitry readily available to those skilled in the art.

The output from the low pass filters 220 and 222 is provided to respective first and second voltage amplifiers 224 and 226. The voltage amplifiers 224 and 226 may comprise conventional circuitry for amplifying the substantially direct current voltage signal output from the first and second low pass filters 220 and 222. The output from the first and second voltage amplifiers 224 and 226 comprise the control signal output from the first and second control circuits 208 and 210, respectively.

It will be readily apparent to those skilled in the art that the first and second control circuits comprise conventional circuitry typically found in the feed forward path of a divide-by-N phase-locked loop. In other words, conventional divide-by-N phase-locked loops typically include a phase detector, low pass filter, and voltage amplifier constructed in the manner as the phase detector 216, low pass filter 220, and voltage amplifier 224 of the control circuit 208. However, it will be further appreciated by those skilled in the art that the conventional divide-by-N phase-locked loop does not include a plurality of control circuits for combining a plurality of feedback signals with a reference signal to provide a plurality of control signals. Further, conventional divide-by-N phase-locked loops do not include a signal adder for combining the plurality of control signals to provide a composite control signal which comprises the input for the voltage controlled oscillator of the divide-by-N phase-locked loop.

The variable divider circuitry 204 comprises first and second constant dividers 228 and 230, respectively, each adapted to divide the frequency $f_o$ of the variable frequency output signal by a fixed constant K. The output from the first constant frequency divider 228 is provided to a variable frequency divider 232. The variable frequency divider 232 is constructed for dividing the frequency of its input signal by a selectable constant N. The variable frequency divider circuit 232 may comprise any of a variety of known variable divider circuits readily available to those skilled in the art.

The output from the variable divider circuit 232 is provided to the data input of first and second data flip flops 234 and 236. The first and second data flip flops 234 and 236 are further constructed to receive the output from the first and second constant divider circuits 228 and 230 at their respective clock inputs. Accordingly, the output Q from the first and second data flip flops 234 and 236 comprises the first and second feedback signals $f_{1b}$ and $f_{2b}$, respectively. It will be apparent to those skilled in the art that the output from the first and second data flip flops 234 and 236 will be a voltage signal having a frequency equal to the frequency of the signal output from the variable frequency divider circuit 232. It will further be apparent to those skilled in the art that the phase of the first and second feedback signals $f_{1b}$ and $f_{2b}$ will be substantially equal.

The first and second data flip flops 234 and 236 may comprise conventional data flip flop circuitry readily available to those skilled in the art. Alternatively, the first and second data flip flops 234 and 236 may comprise clocking circuits for providing the first and second feedback signals $f_{1b}$ and $f_{2b}$ so that their phase and amplitude are substantially equal and so that their respective phase noise components are not substantially correlated. Further alternative clocking circuits may include a clock input coupled to receive the variable frequency output signal and a data input coupled to receive the output from the variable divider circuit 232. These clocking circuits may be constructed to sample their data inputs during a predetermined transition of their clock input to provide one of the plurality of feedback signals. Other variations for clocking circuits will readily become apparent to those skilled in the art.

The first and second constant divider circuits 228 and 230 are provided for scaling the frequency $f_o$ of the variable frequency output signal to a frequency within the operational range of the first and second data flip flops 234 and 236. Accordingly, in cases where the variable frequency output signal is within the operational range of the first and second data flip flops 234 and 236, no constant divider will be necessary and the variable frequency output signal can be coupled directly to the clock input of the first and second data flip flops 234 and 236. A plurality of constant divider circuits are provided so that phase noise transmitted to the feedback signals from the divider circuit will be substantially uncorrelated. Accordingly, in cases where the divider circuit provides substantially no phase noise, only a single divider will be necessary.

A synchronization circuit 238 is provided to sample the output phase difference between the first and second feedback signals $f_{1b}$ and $f_{2b}$ and provide a signal to the first and second constant divider circuits 228 and 230 to synchronize their outputs. The signal may comprise a pulse to reset one of the constant dividers 228 or 230 when the feedback signals $f_{1b}$ and $f_{2b}$ are not in phase. Circuitry for implementing the synchronization of the first and second constant dividers 228 and 230 will readily become apparent to those skilled in the art.

Synchronization of the output from the first and second constant divider circuit 228 and 230 maintains the phase of the signal component of the first and second feedback signals substantially equal. It will be apparent to those skilled in the art that by maintaining the phase of the signal component of the first and second feedback signals substantially equal, the substantially direct current voltage of the signal component of the control signals provided by the first and second control circuits 208 and 210 will be substantially equal. If the phase of the signal component of the first and second feedback signals is not maintained substantially equal, then the signal component of the control signals provided by the first and second control circuits 208 and 210 will not be substantially equal and the variable frequency output signal from the phase-locked loop 200 will not lock at the desired frequency.

Figure 3:
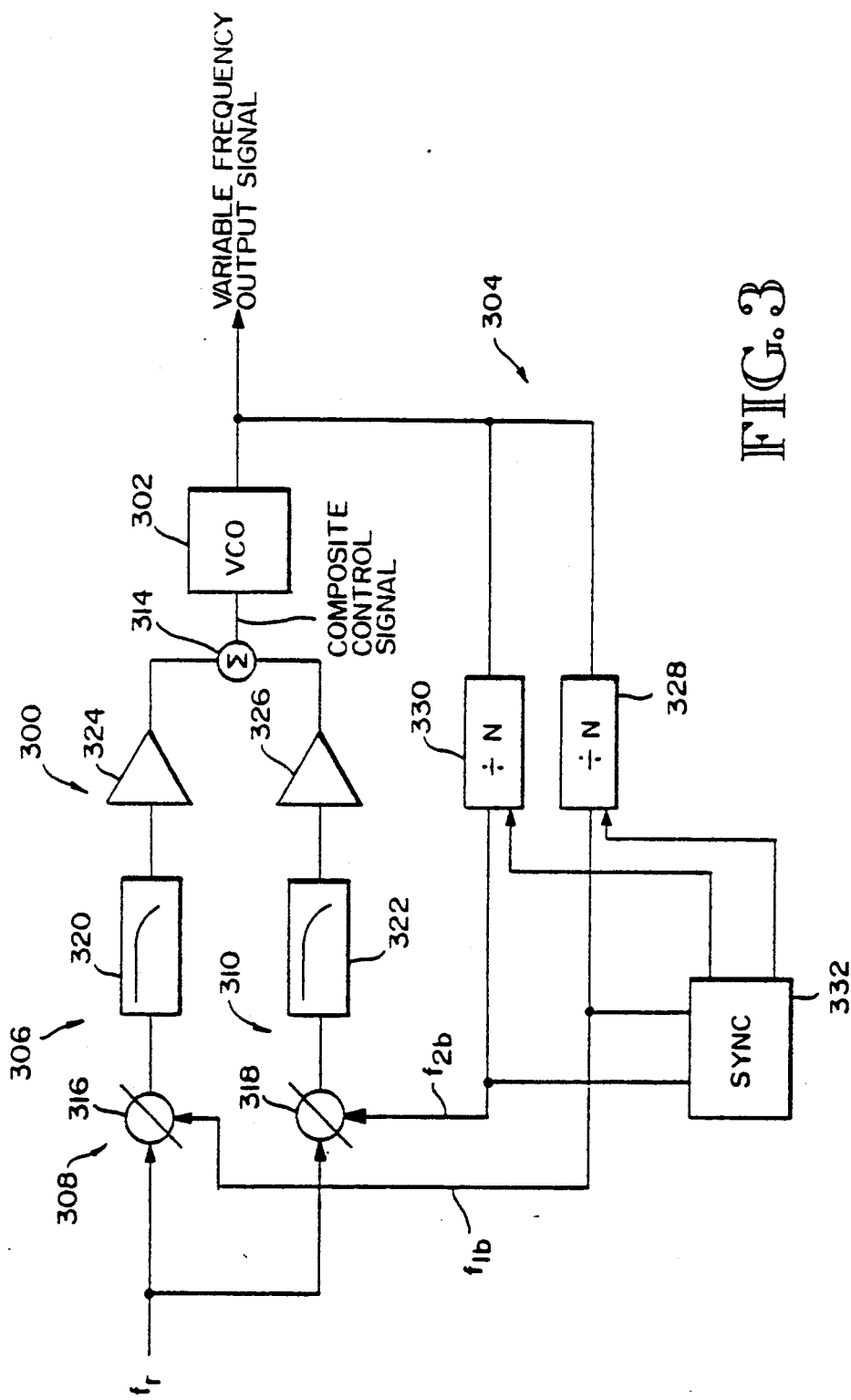
FIG. 3 is a block diagram of a second embodiment of the invention.

FIG. 3 is a detailed illustrative block diagram of a phase-locked loop 300 also constructed in accordance with the subject invention. The phase-locked loop 300 includes a voltage controlled oscillator 302 constructed to respond to a composite control signal to provide the variable frequency output signal in the same manner as the voltage controlled oscillators 202 and 102. The variable frequency output signal is provided to a variable divider circuitry 304 which provides first and second feedback signals $f_{1b}$ and $f_{2b}$.

The phase-locked loop 300 further includes a composite control circuit 306 having first and second control circuits 308 and 310 constructed to operate in the same manner as the first and second control circuits 208 and 210 illustrated in FIG. 2. Like the first and second control circuits 208 and 210, the first and second control circuits 308 and 310 further include first and second phase detectors 316 and 318, first and second low pass filters 320 and 322, and first and second voltage amplifiers 324 and 326. The composite control circuit 306 also includes an adder circuit 314. Each of the foregoing elements of the composite control circuit 306 functions in a manner similar to its corresponding element of the composite control circuit 206 illustrated in FIG. 2.

The variable divider circuitry 304 illustrated in FIG. 3 comprises first and second variable frequency dividers 328 and 330 each adapted to receive as its input the variable frequency output signal from the voltage controlled oscillator 302. The first and second variable frequency divider circuits 328 and 330 are each constructed to divide the frequency $f_o$ of the variable frequency output signal by a selectable constant N to provide the first and second feedback signals $f_{1b}$ and $f_{2b}$, respectively. The first and second feedback signals $f_{1b}$ and $f_{2b}$ are monitored by a synchronization circuit 332 which synchronizes the output from the first and second variable divider circuits 328 and 330 thereby to maintain the phase of the first and second feedback signals $f_{1b}$ and $f_{2b}$ substantially equal.

It will be apparent to those skilled in the art that the variable divider circuits 204 and 304 illustrated in FIGS. 2 and 3, respectively, are each constructed to provide first and second feedback signals having signal components with phases and amplitudes that are substantially equal. Further, the first and second data flip flops 234 and 236 of FIG. 2 and the first and second variable divider circuits 328 and 330 of FIG. 3 are each constructed so that any phase noise components provided to the first and second feedback signals are not substantially correlated. Accordingly, the phase noise components of the feedback signals will add as the square root of the sum of their squares in the adder circuits 214 and 314 of FIGS. 2 and 3, respectively, while the signal components will add by linear superposition.

It will also be apparent to those skilled in the art that although the variable divider circuits 204 and 304 of FIGS. 2 and 3, respectively, are each illustrated as providing only first and second feedback signals, that a plurality of m feedback signals may be provided along with a respective plurality of m control circuits. In general, a 3x decibel reduction in phase noise will be provided for $2^x$ stages.

Although only several embodiments of my novel phase-locked loop have been described in detail herein, it will be readily apparent to those skilled in the art that many modifications and variations thereof may be made without the parting from the true scope and spirit of my invention. It is therefore my intention, by the appended claims, to protect each of these variations and modifications as fall within the true scope and spirit of my invention.

We claim:

1. An improved phase-locked loop for providing a variable frequency output signal comprising:

voltage controlled oscillator means responsive to a composite control signal for providing said variable frequency output signal;

variable divider means for dividing the frequency of said variable frequency output signal by a selectable value to provide a plurality of feedback signals, each including respective signal and noise components, wherein the phase of the signal component of each of said plurality of feedback signals is substantially equal and wherein the noise component of any one of said plurality of feedback signals is not substantially correlated with the noise component of any other of said plurality of feedback signals; and control means responsive to said plurality of feedback signals and a reference signal to provide said composite control signal wherein said composite control signal is a substantially direct current voltage having a magnitude that is a function of the phase difference between said reference signal and said plurality of feedback signals, said control means being adapted to combine the signal components and the noise components of said plurality of feedback signals in a manner to substantially improve the signal to noise ratio of said variable frequency output signal.

2. The improved phase-locked loop recited in claim 1 wherein said control means comprises:

a plurality of control circuit means each responsive to said reference signal and a respective one of said plurality of feedback signals to provide a control signal having a signal component and a noise component wherein the signal component of said control signal is a substantially direct current voltage having a voltage magnitude that is a function of the phase difference between said reference signal and said respective one of said plurality of feedback signals, and wherein the noise component of said control signal is substantially equal to the noise component of the respective one of said plurality of feedback signals from which said control signal originated, said plurality of control circuit means thereby providing a respective plurality of control signals; and signal adder means for adding said plurality of control signals so that the signal components of said plurality of control signals combine to provide a signal representing substantially the maximum increase in the signal component and so that the noise component of said plurality of control signals add by the square root of the sum of their squares, the combination of said plurality of control signals providing said composite control signal.

3. The improved phase-locked loop recited in claim 1 wherein said variable divider means comprises:

variable frequency divider means for dividing the frequency of said variable frequency output signal by said selectable constant to provide a frequency control signal; and a plurality of clocking means for providing said plurality of feedback signals, each of said plurality of clocking means having a clock input coupled to receive said variable frequency output signal and a data input coupled to receive said frequency control signal, each of said plurality of clocking means being constructed to sample said frequency control signal during a predetermined transition of said variable frequency output signal to provide a respective one of said plurality of feedback signals.

4. The improved phase-locked loop recited in claim 3 further comprising delay means for delaying the transition of said variable frequency output signal to provide a delayed feedback signal, said plurality of clocking means being responsive to a predetermined transition of said delayed feedback signal to provide said plurality of feedback signals.

5. The improved phase-locked loop recited in claim 3 further comprising means for dividing the frequency of said variable frequency output signal by a fixed constant to provide a divided feedback signal, said plurality of clocking means being responsive to a predetermined transition of said divided feedback signal to provide said plurality of feedback signals.

6. The improved phase-locked loop recited in claim 3 wherein said plurality of clocking means comprises a respective plurality of data flip flops.

7. The improved phase-locked loop recited in claim 1 wherein said variable divider means comprises a plurality of variable frequency divider means each for dividing the frequency of said variable frequency output signal by a selectable constant to provide said plurality of feedback signals; and means for synchronizing the output of said plurality of variable frequency divider means thereby to maintain the phase of the signal component of said plurality of feedback signals substantially constant.

8. The improved phase-locked loop recited in claim 3 wherein said control means comprises:

a plurality of control circuit means each responsive to said reference signal and a respective one of said plurality of feedback signals to provide a control signal having a signal component and a noise component wherein the signal component of said control signal is a substantially direct current voltage having a voltage magnitude that is a function of the phase difference between said reference signal and said respective one of said plurality of feedback signals, and wherein the noise component of said control signal is substantially equal to the noise component of the respective one of said plurality of feedback signals from which said control signal originated, said plurality of control circuit means thereby providing a respective plurality of control signals; and signal adder means for adding said plurality of control signals so that the signal components of said plurality of control signals add to provide a signal representing the maximum increase in the signal components and so that the noise component of said plurality of control signals add by the square root of the sum of their squares, the combination of said plurality of control signals providing said composite control signal.

9. The improved phase-locked loop recited in claim 7 wherein said control means comprises:

a plurality of control circuit means each responsive to said reference signal and a respective one of said plurality of feedback signals to provide a control signal having a signal component and a noise component wherein the signal component said control signal is a substantially direct current voltage having a voltage magnitude that is a function of the phase difference between said reference signal and said respective one of said plurality of feedback signals, and wherein the noise component of said control signal is substantially equal to the noise component of the respective one of said plurality of feedback signals from which said control signal originates, said plurality of control circuit means thereby providing a respective plurality of control signals; and signal adder means for adding said plurality of control signals so that the signal components of said plurality of control signals add to provide a signal representing the maximum signal components and so that the noise component of said plurality of control signals add by the square root of the sum of their squares, the combination providing said composite control signal.

10. An improved phase-locked loop for providing a variable frequency output signal comprising:

first control circuit means responsive to a reference signal and a first feedback signal to provide a first control signal wherein said first control signal is a substantially direct current voltage having a voltage magnitude that is a function of the phase difference between said reference signal and said first feedback signal;

second control circuit means responsive to said reference signal and a second feedback signal to provide a second control signal wherein said second control signal is a substantially direct current voltage having a voltage magnitude that is a function of the phase difference between said reference signal and said second feedback signal;

signal adder means for combining said first and second control signals to provide a composite control signal;

voltage controlled oscillator means responsive to said composite control signal for providing said variable frequency output signal wherein the frequency of said variable frequency output signal is a function of the voltage magnitude of said composite control signal;

variable frequency divider means for dividing the frequency of said variable frequency output signal by a variable divisor to provide a frequency control signal wherein the value of said variable divisor determines the frequency of said variable frequency output signal; and first and second clocking means responsive to said variable frequency output signal and said frequency control signal for providing said first and second feedback signals, respectively, said first and second feedback signals being provided so that they include respective first and second signal and noise components wherein the phase of said first and second signal components is substantially equal so that said first and second signal components add to provide a signal representing the maximum magnitude of the signal component and wherein said first and second noise components are not substantially correlated so that said first and second noise components add by the square root of the sum of their squares, said signal adder means thereby improving the signal to noise ratio of said variable frequency output signal.

11. The improved phase-locked loop recited in claim 10 further comprising delay means for delaying the transition of said variable frequency output signal to provide a delayed feedback signal wherein said first and second clocking means are responsive to said delayed feedback signal and said frequency control signal to provide said first and second feedback signals.

12. The improved phase-locked loop recited in claim 10 further including fixed frequency divider means for dividing the frequency of said variable frequency output signal by a fixed constant to provide a divided feedback signal wherein said first and second clocking means are responsive to said divided feedback signal and said frequency control signal to provide said first and second feedback signals.

13. The improved phase-locked loop recited in claim 10 wherein said first and second clocking means comprise data flip flops.

14. An improved phase-locked loop for providing a variable frequency output signal comprising:

first control circuit means responsive to a reference signal and a first feedback signal to provide a first control signal wherein said first control signal is a substantially direct current voltage having a voltage magnitude that is a function of the phase difference between said reference signal and said first feedback signal;

second control circuit means responsive to said reference signal and a second feedback signal to provide a second control signal wherein said second control signal is a substantially direct current voltage having a voltage magnitude that is a function of the phase difference between said reference signal and said second feedback signal;

signal adder means for providing a composite control signal that represents the arithmetic sum of the magnitude of said first and second control signals, the arithmetic sum representing the maximum signal component and a reduced noise component;

voltage controlled oscillator means responsive to said composite control signal for providing said variable frequency output signal wherein the frequency of said variable frequency output signal is a function of the voltage magnitude of said composite control signal;

first and second variable frequency divider means each for dividing the frequency of said variable frequency output signal by a variable divisor to provide said first and second feedback signals, respectively, wherein the value of said variable divisor determines the frequency of said variable frequency output signal; and means for synchronizing the output of said first and second variable frequency divider means.

15. A phase-locked loop for providing a variable frequency output signal of a predetermined frequency comprising:

first and second phase detectors each being coupled to receive a reference signal, said first and second phase detectors further being coupled to receive respective first and second feedback signals, said first phase detector being constructed to provide a first control signal that is a function of the phase difference between said reference signal and said first feedback signal and said second phase detector being constructed to provide a second control signal that is a function of the phase difference between said reference signal and said second feedback signal;

first and second low pass filters coupled to receive said first and second control signals, respectively, and being constructed to filter out high frequency components of said first and second control signals to provide respective first and second filtered control signals;

first and second amplifiers respectively coupled to amplify said first and second filtered control signals to provide first and second amplified control signals;

a signal adder constructed to provide a composite control signal that represents the arithmetic sum of the magnitude of said first and second amplified control signals;

a voltage controlled oscillator responsive to said composite control signal for providing said variable frequency output signal having a frequency that is a function of the voltage magnitude of said composite control signal;

a fixed frequency divider constructed to divide the frequency of said variable frequency output signal by a constant divisor thereby to provide a divided feedback signal;

a variable frequency divider constructed to divide the frequency of said divided feedback signal by a variable divisor to provide a frequency control signal wherein the value of said variable divisor determines the frequency of said variable frequency output signal;

means for delaying the transition of said divided feedback signal thereby to provide a delayed feedback signal; and first and second flip flops, said first and second flip flops having respective first and second clock inputs each coupled to receive said delayed feedback signal, said first and second flip flops having respective first and second data inputs each coupled to receive said frequency control signal, said first and second flip flops being constructed to provide said first and second feedback signals, respectively, the magnitude of said first and second feedback signals being substantially equal to the magnitude of said frequency control signal during a predetermined transition of said delayed feedback signal, said first and second feedback signals including first and second noise components introduced substantially by said first and second flip flops, wherein said first noise component is not correlated with said second noise component so that said first and second noise components add by the square root of the sum of their squares to thereby substantially improve the signal-to-noise ratio of said composite control signal and said variable frequency output signal.

16. A method for providing a variable frequency output signal comprising the steps of:
   (a) responding to the voltage magnitude of a composite control signal to provide the variable frequency output signal;
   (b) dividing the frequency of the variable frequency output signal by a selectable constant to provide a plurality of feedback signals each including respective signal and noise components, said plurality of feedback signals being provided so that the phase of the signal components of the plurality of feedback signals is substantially constant and so that the noise components of the plurality of feedback signals are not substantially correlated; and
   (c) combining the plurality of feedback signals with a reference signal to provide the composite control signal wherein the composite control signal is a substantially direct current voltage having a voltage magnitude that is a function of the phase difference between the reference signal and the plurality of feedback signals and wherein the respective noise and signal components of the plurality of feedback signals are combined in a manner to improve the signal-to-noise ratio of the variable frequency output signal.

17. The method as recited in claim 16 wherein step c, combining the plurality of feedback signals comprises the substeps of:
   (d) combining the plurality of feedback signals with the reference signal to provide a respective plurality of control signals wherein each of the respective plurality of control signals is a substantially direct current voltage signal the magnitude of which is indicative of the phase difference between the reference signal and the respective one of the plurality of feedback signals which constituted its origin; and
   (e) adding the plurality of control signals to provide the composite control signal wherein the noise components of the plurality of feedback signals are combined by the square root of the sum of their squares and wherein the signal components of the plurality of feedback signals are combined by linear superposition.

18. The method as recited in claim 16 wherein step (b), dividing the frequency of the variable frequency output signal comprises the substeps of:
   (f) dividing the frequency of the variable frequency output signal by a selectable constant to provide a frequency control signal wherein the value of the selectable constant is determinative of the frequency of the variable frequency output signal; and
   (g) reclocking the frequency control signal through a plurality of clocking devices to provide the plurality of feedback signals, the plurality of clocking devices being adapted to provide the plurality of feedback signals with respective noise components that are not substantially correlated and with respective signal components having substantially equal phase.

19. The method as recited in claim 16 wherein step (b), dividing the variable frequency output signal comprises the substeps of:
   (h) providing a plurality of variable dividers to divide the variable frequency output signal by a selectable constant to provide the plurality of feedback signals, wherein the value of the selectable constant is determinative of the frequency of the variable frequency output signal; and
   (i) synchronizing the plurality of variable dividers so that the noise components of the plurality of feedback signals have substantially the same phase.

* * * * *